US012586003B2

(12) United States Patent
Xing et al.

(10) Patent No.: US 12,586,003 B2
(45) Date of Patent: Mar. 24, 2026

(54) METHOD AND APPARATUS FOR GENERATING OPERATOR

(71) Applicant: Beijing Baidu Netcom Science Technology Co., Ltd., Beijing (CN)

(72) Inventors: Feng Xing, Beijing (CN); Xiang Lan, Beijing (CN); Liling Niu, Beijing (CN); Xiandong Liu, Beijing (CN); Yanjun Ma, Beijing (CN); Dianhai Yu, Beijing (CN); Haifeng Wang, Beijing (CN)

(73) Assignee: Beijing Baidu Netcom Science Technology Co., Ltd., Beijing (CN)

( * ) Notice: Subject to any disclaimer, the term of this patent is extended or adjusted under 35 U.S.C. 154(b) by 866 days.

(21) Appl. No.: 17/887,951

(22) Filed: Aug. 15, 2022

(65) Prior Publication Data

US 2022/0391774 A1 Dec. 8, 2022

(30) Foreign Application Priority Data

Dec. 10, 2021 (CN) .......................... 202111503431.6

(51) Int. Cl.
*G06N 20/10* (2019.01)
*G06F 8/30* (2018.01)
(Continued)

(52) U.S. Cl.
CPC ............. *G06N 20/10* (2019.01); *G06F 9/547* (2013.01); *G06F 8/31* (2013.01); *G06F 8/35* (2013.01);
(Continued)

(58) Field of Classification Search
CPC .......... G06N 20/10; G06N 20/00; G06N 3/10; G06F 8/35; G06F 8/36; G06F 8/51;
(Continued)

(56) References Cited

U.S. PATENT DOCUMENTS 10,216,548 B1 2/2019 Zhang et al.
2016/0092181 A1 3/2016 Rodgers et al.
(Continued)

FOREIGN PATENT DOCUMENTS

CA 2815800 A 11/2013
CN 109447256 A 3/2019
(Continued)

OTHER PUBLICATIONS

Notice of Allowance dated Feb. 27, 2025 in Korean Application No. 10-2022-0106027, 3 pages.
(Continued)

*Primary Examiner* — Quoc A Tran
(74) *Attorney, Agent, or Firm* — Knobbe, Martens, Olson & Bear, LLP

(57) ABSTRACT

A method and apparatus for generating an operator are provided. The method includes: constructing a group of basic application programming interfaces for providing one of the following basic functions: an access function, a storage function, and a computing function; constructing a kernel application programming interface for invoking the basic application programming interfaces to implement an operator logic; and generating a target kernel operator based on the group of basic application programming interfaces and the kernel application programming interface.

12 Claims, 6 Drawing Sheets

100

103

102

104

105

101

(51) Int. Cl.

| | |
|---|---|
| *G06F 8/35* | (2018.01) |
| *G06F 8/36* | (2018.01) |
| *G06F 8/41* | (2018.01) |
| *G06F 8/51* | (2018.01) |
| *G06F 9/448* | (2018.01) |
| *G06F 9/451* | (2018.01) |
| *G06F 9/54* | (2006.01) |
| *G06F 16/30* | (2019.01) |
| *G06F 30/20* | (2020.01) |
| *G06N 3/10* | (2006.01) |
| *G06N 20/00* | (2019.01) |

(52) U.S. Cl.
CPC ................. *G06F 8/36* (2013.01); *G06F 8/41* (2013.01); *G06F 8/44* (2013.01); *G06F 8/51* (2013.01); *G06F 9/448* (2018.02); *G06F 9/4482* (2018.02); *G06F 9/451* (2018.02); *G06F 9/545* (2013.01); *G06F 16/30* (2019.01); *G06F 30/20* (2020.01); *G06N 3/10* (2013.01); *G06N 20/00* (2019.01)

(58) Field of Classification Search
CPC .......... G06F 9/545; G06F 8/31; G06F 9/4482; G06F 9/448; G06F 9/451; G06F 8/41; G06F 8/44; G06F 16/30; G06F 30/20
See application file for complete search history.

(56) References Cited

U.S. PATENT DOCUMENTS

| | | | |
|---|---|---|---|
| 2018/0293057 | A1 | 10/2018 | Sun et al. |
| 2020/0334572 | A1 | 10/2020 | Zhang et al. |
| 2021/0081837 | A1 | 3/2021 | Polleri et al. |
| 2021/0294602 | A1 | 9/2021 | Jakubiuk et al. |
| 2023/0039180 | A1* | 2/2023 | Luitjens ................ G06F 9/3877 |

FOREIGN PATENT DOCUMENTS

| | | |
|---|---|---|
| CN | 1109447256 A | 3/2019 |
| CN | 110908797 A | 3/2020 |
| CN | 110929883 A | 3/2020 |
| CN | 111695501 A | 9/2020 |
| CN | 111782181 A | 10/2020 |
| CN | 11213577 A | 4/2021 |
| CN | 112613577 A | 4/2021 |
| IN | 112860420 A | 5/2021 |
| JP | 2015-149038 A | 8/2015 |
| KR | 10-2021-0082401 A | 7/2021 |
| KR | 10-2022-0040352 A | 3/2022 |

OTHER PUBLICATIONS

OpenMP task generation using Batched Kernel API from https://jglobal.jst.go_jp/detail?JGLOBAL_ID=201902250649754535, retrieved on Aug. 30, 2022, in 3 pages.

Higuchi et al., "CIPy: A NumPy-compatible Library Accelerated with OpenCL", 2019 IEEE International Parallel and Distributed Processing Symposium Workshops (IPDPSW), IEEE, May 20, 2019 (May 20, 2019), pp. 933-940.

First Office Action issued in European Patent Application No. 22189729.1 dated Aug. 27, 2025, in 13 pages.

* cited by examiner

100

103

102

101

104

105

<u>400</u>

401 — constructing a group of basic application programming interfaces

402 — constructing a kernel application programming interface

403 — generating a target kernel operator based on three types of basic application programming interfaces in the group of basic application programming interfaces and the kernel application programming interface

METHOD AND APPARATUS FOR GENERATING OPERATOR

CROSS-REFERENCE TO RELATED APPLICATIONS

The present application claims the priority of Chinese Patent Application No. 202111503431.6, titled "METHOD AND APPARATUS FOR GENERATING OPERATOR", filed on Dec. 10, 2021, which is incorporated herein by reference in its entirety.

TECHNICAL FIELD

The present disclosure relates to the technical field of computers, specifically relates to the technical field of neural networks, and more specifically relates to a method and apparatus for generating an operator.

BACKGROUND

At present, a deep neural network framework contains a large number of operators. In a current operator system, it is required to separately develop a Kernel function for each operator. For different hardware, Kernel implementations are different, i.e., each hardware platform for each operator in an existing deep learning framework corresponds to at least one Kernel.

SUMMARY

Embodiments of the present disclosure provide a method and apparatus for generating an operator, a device, and a storage medium.

Some embodiments of the present disclosure provide a method for generating an operator, including: constructing a group of basic application programming interfaces for providing one of the following basic functions: an access function, a storage function, and a computing function; constructing a kernel application programming interface for invoking the basic application programming interfaces to implement an operator logic; and generating a target kernel operator based on the group of basic application programming interfaces and the kernel application programming interface.

Some embodiments of the present disclosure provide an apparatus for generating an operator, including: a first constructing module configured to construct a group of basic application programming interfaces for providing one of the following basic functions: an access function, a storage function, and a computing function; a second constructing module configured to construct a kernel application programming interface for invoking the basic application programming interfaces to implement an operator logic; and a target generating module configured to generate a target kernel operator based on the group of basic application programming interfaces and the kernel application programming interface.

Some embodiments of the present disclosure provide an electronic device, including: one or more processors; and a storage apparatus storing one or more programs thereon, where the one or more programs, when executed by the one or more processors, cause the one or more processors to implement the above method for generating an operator.

Some embodiments of the present disclosure provide a computer readable medium storing a computer program thereon, where the program, when executed by a processor, implements the above method for generating an operator.

Some embodiments of the present disclosure provide a computer program product including a computer program, where the computer program, when executed by a processor, implements the above method for generating an operator.

It should be understood that contents described in the SUMMARY are neither intended to identify key or important features of embodiments of the present disclosure, nor intended to limit the scope of the present disclosure. Other features of the present disclosure will become readily understood with reference to the following description.

DETAILED DESCRIPTION OF EMBODIMENTS

Example embodiments of the present disclosure are described below with reference to the accompanying drawings, including various details of the embodiments of the present disclosure to contribute to understanding, which should be considered merely as examples. Therefore, those of ordinary skills in the art should realize that various alterations and modifications may be made to the embodiments described here without departing from the scope and spirit of the present disclosure. Similarly, for clearness and conciseness, descriptions of well-known functions and structures are omitted in the following description.

It should be noted that the embodiments in the present disclosure and the features in the embodiments may be combined with each other on a non-conflict basis. The present disclosure will be described in detail below with reference to the accompanying drawings and in combination with the embodiments.

Figure 1:
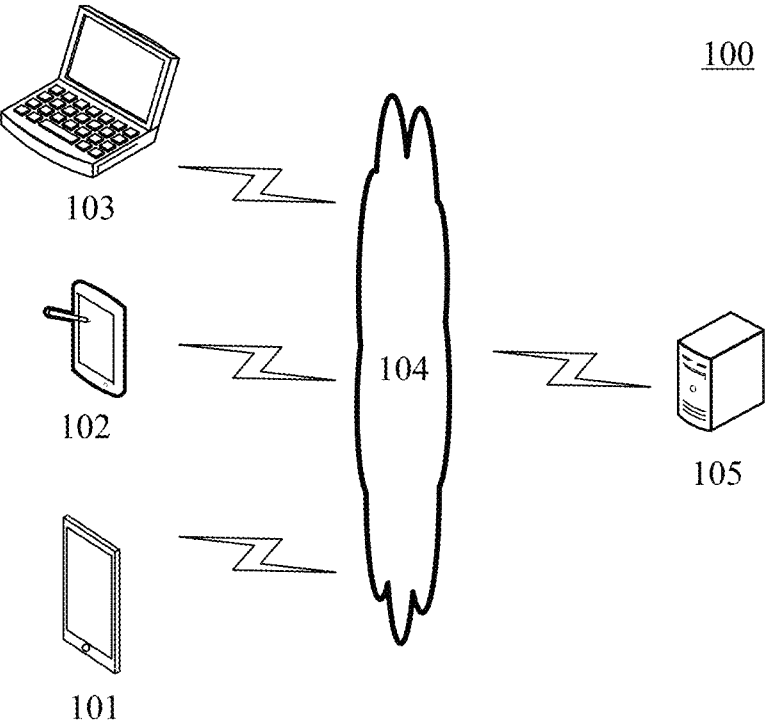
FIG. 1 is a diagram of an exemplary system architecture in which embodiments of the present disclosure may be implemented.

FIG. 1 shows an exemplary system architecture 100 in which a method for generating an operator of an embodiment of the present disclosure may be applied.

As shown in FIG. 1, the system architecture 100 may include terminal devices 101, 102, and 103, a network 104, and a server 105. The network 104 serves as a medium providing a communication link between the terminal devices 101, 102, and 103, and the server 105. The network 104 may include various types of connections, such as wired or wireless communication links, or optical cables.

A user may interact with the server 105 using the terminal devices 101, 102, and 103 via the network 104, e.g., to receive or send a message. The terminal devices 101, 102, and 103 may be provided with a deep neural network framework.

The terminal devices 101, 102, and 103 may be hardware, or may be software. When the terminal devices 101, 102, and 103 are hardware, the terminal devices may be various electronic devices having display screens, including but not limited to a mobile phone and a notebook computer. When the terminal devices 101, 102, and 103 are software, the terminal devices may be installed in the above-listed electronic devices, or may be implemented as a plurality of software programs or software modules (e.g., software programs or software modules for providing operator generating services), or may be implemented as a single software program or software module. This is not specifically limited here.

The server 105 may be a server providing various services, for example, constructing a group of basic application programming interfaces for providing one of the following basic functions: an access function, a storage function, and a computing function; constructing a kernel application programming interface for invoking the basic application programming interfaces to implement an operator logic; and generating a target kernel operator based on the group of basic application programming interfaces and the kernel application programming interface.

It should be noted that the server 105 may be hardware, or may be software. When the server 105 is hardware, the server may be implemented as a distributed server cluster composed of a plurality of servers, or may be implemented as a single server. When the server is software, the server may be implemented as a plurality of software programs or software modules (e.g., software programs or software modules for providing an operator generating service), or may be implemented as a single software program or software module. This is not specifically limited here.

It should be noted that the method for generating an operator provided in the embodiment of the present disclosure may be executed by the server 105, or may be executed by the terminal devices 101, 102, and 103, or may be executed by the server 105 and the terminal devices 101, 102, and 103 through cooperation with each other. Accordingly, each part (for example, each unit, sub-unit, module, and sub-module) included in an apparatus for generating an operator may be entirely arranged in the server 105, or may be entirely arranged in the terminal devices 101, 102, and 103, or may be arranged in the server 105 and the terminal devices 101, 102, and 103, respectively.

It should be understood that the numbers of terminal devices, networks, and servers in FIG. 1 are merely illustrative. Any number of terminal devices, networks, and servers may be provided based on actual requirements.

Figure 2:
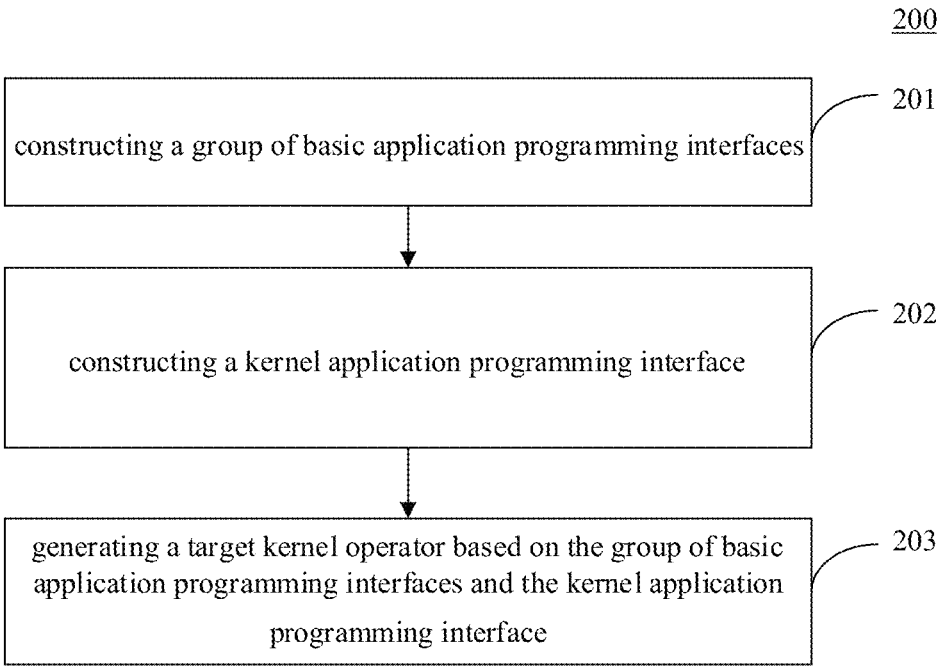
FIG. 2 is a flowchart of a method for generating an operator according to an embodiment of the present disclosure.

FIG. 2 shows a schematic flowchart 200 of a method for generating an operator of an embodiment. The method for generating an operator includes the following steps 201 to step 203.

Step 201: constructing a group of basic application programming interfaces.

In the present embodiment, an executing body (for example, the server 105 or the terminal devices 101, 102, and 103 in FIG. 1) may construct a group of basic application programming interfaces, i.e., basic APIs (application programming interfaces), i.e., a group of primitive APIs. A basic API corresponds to a module-level device function, which is a function that completes functions using multi-threading in a multi-threaded environment, and provide at least one of the following basic functions: an access function (i.e., a data reading function), a storage function (i.e., a data writing function), and a computing function.

The APIs are predefined functions designed to provide a group of routines that are accessible to applications and developers based on a certain software or hardware, without accessing source codes or understanding details of internal working mechanisms.

Here, the basic APIs are mainly oriented towards a SIMD (single instruction multiple data) hardware architecture, for example, a GPU (graphics processing unit), or a NPU (embedded neural network processing unit).

Specifically, in a multi-threaded environment of the SIMD hardware architecture, the basic APIs are simultaneously invoked by multiple threads, for example, thread1, thread2, and thread3, and each thread has its own local memory space and a shared memory space.

It should be noted that the basic APIs cannot be separately used as kernel operators, and basic APIs invokable by different hardware devices are different.

Here, the group of basic APIs may include one or more basic APIs.

Specifically, the group of basic APIs may include 10 basic APIs, one basic API of the 10 basic APIs is used for providing an access function, another one basic API of the 10 basic APIs is used for providing a storage function, and the remaining 8 basic APIs of the 10 basic APIs are used for providing different computing functions.

Step 202: constructing a kernel application programming interface.

In the present embodiment, the executing body constructs the kernel application programming interface, i.e., a kernel API, which corresponds to a kernel-level function. Each kernel operator corresponds to a kernel API, and the kernel API is used for invoking a basic API to implement an operator logic.

Here, the kernel API may be applied to different hardware devices.

Step 203: generating a target kernel operator based on the group of basic application programming interfaces and the kernel application programming interface.

In the present embodiment, the executing body may generate the target kernel operator based on one or more basic APIs in the group of basic APIs and the kernel API, i.e., invoke one or more basic APIs in the group of basic APIs using a kernel operator, to generate the target internal operator.

Specifically, the group of basic APIs may include 5 basic APIs, one basic API of the 5 basis APIs is used for providing an access function, another one basic API of the 5 basis APIs is used for providing a storage function, and the remaining 3 basic APIs of the 5 basis APIs are used for providing different computing functions. The 3 basic APIs for providing different computing functions are a basic API for providing a computing function A, a basic API for providing a computing function B, and a basic API for providing a computing function C, respectively. The executing body may invoke, using a kernel operator, a basic API that provides an access function, a basic API that provides a computing function A, and a basic API that provides a storage function in the group of basic APIs, to generate a target kernel operator A; may invoke, using a kernel operator, a basic API that provides an access function, a basic API that provides a computing function A, a basic API that provides a computing function B, and a basic API that provides a storage function in the group of basic APIs, to generate a target kernel operator D; or may invoke, using a kernel operator, a basic API that provides an access function, a basic API that provides a computing function A, a basic API that provides a computing function B, a basic API that provides a computing function C, and a basic API that provides a storage function in the group of basic APIs, to generate a target kernel operator E.

Here, a function of the target kernel operator generally corresponds to a function of the basic API which is used in generating the target kernel operator and provides the computing function.

In some optional implementations, the generating the target kernel operator based on the group of basic application programming interfaces and the kernel application programming interface includes: generating, in response to detecting an updating operation on the basic application programming interfaces, an updated group of basic application programming interfaces based on the updating operation; and generating the target kernel operator based on the updated group of basic application programming interfaces and the kernel application programming interface.

In the present implementation, the executing body may detect whether an updating operation on the basic APIs is performed by a user in real time or periodically, generate, in response to determining that an updating operation on the basic APIs is performed by a user in real time or periodically, the updated group of basic APIs based on the updating operation, and generate the target kernel operator based on the updated group of basic APIs and the kernel API.

The present implementation generates, in response to detecting an updating operation on the basic APIs, the updated group of basic APIs based on the updating operation; and generates the target kernel operator based on the updated group of basic APIs and the kernel API. That is, a large number of kernel operators may be optimized and upgraded by directly optimizing and upgrading a group of basic APIs invoked by each kernel operator without upgrading and optimizing the large number of kernel operators one by one, thereby improving a development and optimization efficiency.

In some optional implementations, constructing the group of basic application programming interfaces includes: constructing the group of basic application programming interfaces based on a category of a hardware architecture of the to-be-generated target kernel operator.

In the present implementation, the executing body may first acquire the category of the hardware architecture of the to-be-generated target kernel operator, such as GPU or NPU, and construct a group of basic application programming interfaces adapted to a current hardware architecture based on the category of the hardware architecture.

Specifically, if the category of the hardware architecture of the to-be-generated target kernel operator is GPU, the executing body may construct a group of basic application programming interfaces adapted to the GPU architecture. If the category of the hardware architecture of the to-be-generated target kernel operator is NPU, the executing body may construct a group of basic application programming interfaces adapted to the NPU architecture.

The present implementation constructs a group of basic APIs based on the category of the hardware architecture of the to-be-generated target kernel operator, and then generates a target kernel operator adapted to the current hardware architecture based on the group of basic APIs and the kernel API, thereby generating the target kernel operator based on the group of basic APIs and the kernel API under different hardware architecture conditions, avoiding modifying a large number of kernel operators to adapt to the hardware architecture during hardware migration. That is, it is only necessary to construct a group of basic APIs adapted to the current hardware architecture, and effectively reducing hardware migration costs.

Figure 3:
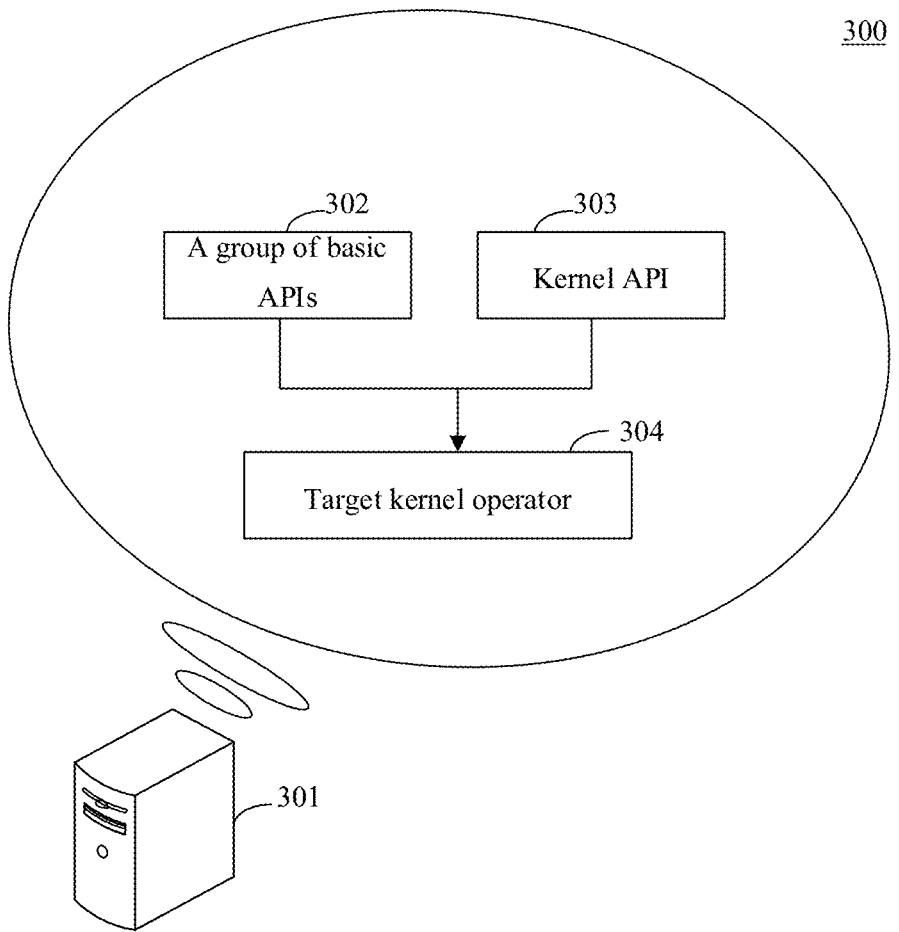
FIG. 3 is a schematic diagram of an application scenario of the method for generating an operator according to the present disclosure.

Further referring to FIG. 3, FIG. 3 is a schematic diagram of an application scenario of the method for generating an operator according to the present embodiment. An executing body 301 may construct a group of basic APIs 302, which may include three types of basic APIs, namely a type of basic API for providing an access function, a type of basic API for providing a storage function, and a type of basic API for providing a computing function, respectively. For example, this group of basic APIs totally include 4 basic APIs, namely a basic API for providing an access function, a basic API for providing a storage function, a basic API for providing a computing function M, and a basic API for providing a computing function N, respectively. Further, the executing body constructs a kernel API 303 for invoking the basic APIs to implement an operator logic; and generates a target kernel operator 304, based on the group of basic APIs 302 and the kernel API 303. For example, the executing body invokes the basic API for providing the access function, the basic API for providing the storage function, and the basic API for providing the computing function M by using the kernel API to generate a target kernel operator M.

The method for generating an operator provided in embodiments of the present disclosure constructs a group of basic APIs for providing one of the following basic functions: an access function, a storage function, and a computing function; constructs a kernel API for invoking the basic APIs to implement an operator logic; and generates a target kernel operator based on the group of basic APIs and the kernel API. That is, by invoking a limited number of basic APIs through the kernel API, it is possible to implement a target kernel operator of any functional type, thereby effectively solving the problem in existing technologies in which it is necessary to separately develop a large number of kernel operators with different functions, effectively accelerating the operator development, and improving the operator maintainability.

Figure 4:
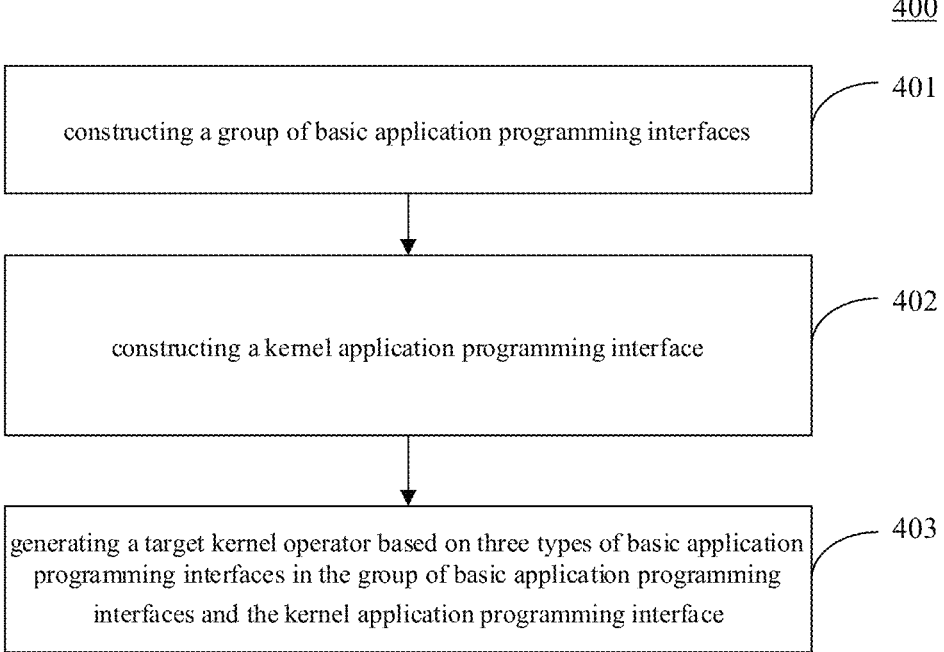
FIG. 4 is a flowchart of the method for generating an operator according to another embodiment of the present disclosure.

Further referring to FIG. 4, a process 400 of the method for generating an operator shown in FIG. 2 according to another embodiment is shown. The process 400 of the method for generating an operator in the present embodiment may include the following step 401 to step 403.

Step 401: constructing a group of basic application programming interfaces.

The description of step 201 may be referred to for the implementation details and technical effects of step 401 in the present embodiment. The description will not be repeated here.

Step 402: constructing a kernel application programming interface.

The description of step 202 may be referred to for the implementation details and technical effects of step 402 in the present embodiment. The description will not be repeated here.

Step 403: generating a target kernel operator based on three types of basic application programming interfaces in the group of basic application programming interfaces and the kernel application programming interface.

In the present embodiment, an executing body may generate the target kernel operator based on three types of basic application programming interfaces in the group of basic application programming interfaces and the kernel application programming interface.

The three types of basic application programming interfaces are a type of input/output application programming interface (i.e., IO API), a type of computing application programming interface (i.e., Compute API), and a type of computing rule application programming interface (i.e., OpFunc API), respectively.

Here, the IO API is used for completing read/write in a global memory and a register, the computing API is a general-purpose computing function, such as Elementwise-Binary or ElementwiseUnary, and the OpFunc API is used for defining a computing rule in the computing API for invoking by the computing API.

Specifically, it is necessary to define the OpFunc API, such as AddFunctor, to implement an ADD operation, for invoking by the Compute API, such as ElementwiseBinary.

Here, a default OpFunc API may be directly used as the OpFunc API, or the OpFunc API may be customized as required. This is not limited in the present disclosure.

It should be noted that the above three types of basic APIs are block-level multi-threaded APIs, in which a data pointer and an operation type of a current block may be directly introduced to complete corresponding computing.

Specifically, data reading, i.e., ReadData, in the IO API is used to read data from the global memory to an on-chip memory, and may be represented by the following CUDA (Compute Unified Device Architecture) programming codes:

```
template<typename Tx,typename Ty,int NX,int NY,int
    BlockSize,bool IsBoundary=false>
_device_void ReadData(Ty*dst,const Tx*src,int size_nx,
    int size_ny,int stride_nx,int stride_ny);
```

Data protocol, i.e., Reduce, in the Compute API is used to reduce the data size on the premise of remaining the original data as far as possible, and may be represented by the following codes:

```
template<typename T,int NX,int NY,int BlockSize,class
    ReduceFunctor, ReduceMode Mode>
_device_void          Reduce(T*out,T*in,ReduceFunctor
    reducer, bool reduce_last_dim);
```

A complete target kernel operator, e.g., an ADD operator, specifically may be represented by the following codes:

```
InT args [2] [VecSize];
OutT result[VecSize];
//load
    kps::Init<InT,VecSize>(args[0],static_cast<InT>(1.0f
));
    kps::Init<InT,VecSize>(args[1],static_cast<InT>(1.0f
));
    kps::ReadData<InT,VecSize,1,1,IsBoundary>(args[0],in
[0]+data_offset,num);
    kps::ReadData<InT,VecSize,1,1,IsBoundary>(args[1],in
[1]+data_offset,num);
    //compute
    kps::ElementwiseBinary<InT,OutT,VecSize,1,1,Functor>
(result,args[0],args[1],func);
    //store
    kps::WriteData<OutT,VecSize,1,1,IsBoundary>(out+data
_offset,result,num);
```

In some optional implementations, the OpFunc application programming interface is set based on user needs.

In the present implementation, the executing body may generate the target kernel operator based on the three types of basic APIs in the group of basic APIs and the kernel API, where the OpFunc API may be customized and generated based on user needs.

This implementation generates the target kernel operator based on three types of basic APIs in the group of basic APIs and the kernel API, where the OpFunc API is set based on user needs, to further improve the development efficiency and flexibility of operators.

Compared with the embodiment shown in FIG. 2, the above embodiment of the present disclosure highlights the constructing a group of basic application programming interfaces; constructing a kernel application programming interface; and generating a target kernel operator based on three types of basic application programming interfaces in the group of basic application programming interfaces and the kernel application programming interface, where the three types of basic application programming interfaces are a type of input/output application programming interface, a type of Compute application programming interface, and a type of OpFunc application programming interface, respectively. That is, the target kernel operator is generated by the limited number of basic application programming interfaces with three types of basic functions: the input/output application programming interface, the compute application programming interface, and the OpFunc application programming interface, and the kernel application programming interface, thereby contributing to further simplifying the codes, and improving the development efficiency and maintainability of operators.

Figure 5:
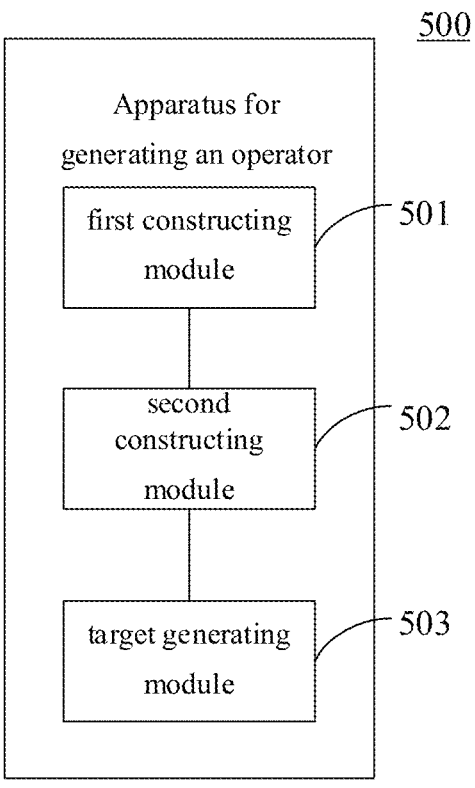
FIG. 5 is a schematic diagram of an apparatus for generating an operator according to an embodiment of the present disclosure.

Further referring to FIG. 5, as an implementation of the method shown in the above figures, an embodiment of the present disclosure provides an apparatus for generating an operator. The embodiment of the apparatus corresponds to the embodiment of the method shown in FIG. 1, and the apparatus may be specifically applied to various electronic devices.

As shown in FIG. 5, the apparatus 500 for generating an operator of the present embodiment includes: a first constructing module 501, a second constructing module 502, and a target generating module 503.

The first constructing module 501 may be configured to construct a group of basic application programming interfaces for providing one of the following basic functions: an access function, a storage function, and a computing function.

The second constructing module 502 may be configured to construct a kernel application programming interface for invoking the basic application programming interfaces to implement an operator logic.

The target generating module 503 may be configured to generate a target kernel operator based on the group of basic application programming interfaces and the kernel application programming interface.

In some optional implementations of the present embodiment, the target generating module is further configured to: generate the target kernel operator based on three types of basic application programming interfaces in the group of basic application programming interfaces and the kernel application programming interface, wherein the three types of basic application programming interfaces are a type of input/output application programming interface, a type of computing application programing interface, and a type of computing rule application programming interface, respectively, wherein the input/output application programming interface is used for completing read/write in a global memory and a register, the computing application programming interface is a general-purpose computing function, and the computing rule application programming interface is used for defining a computing rule in the computing application programming interface for invoking by the computing application programming interface.

In some optional implementations of the present embodiment, the target generating module is further configured to:

generate, in response to detecting an updating operation on the basic application programming interfaces, an updated group of basic application programming interfaces based on the updating operation; and generate the target kernel operator based on the updated group of basic application programming interfaces and the kernel application programming interface.

In some optional implementations of the present embodiment, the first constructing module is further configured to:

construct the group of basic application programming interfaces based on a category of a hardware architecture of the target kernel operator to be generated.

In some optional implementations of the present embodiment, the computing rule application programming interface is set based on user needs.

In the technical solutions of the present disclosure, the acquisition, storage, and application of personal information of a user involved are in conformity with relevant laws and regulations, and do not violate public order and good customs.

According to an embodiment of the present disclosure, the present disclosure further provides an electronic device, a readable storage medium, and a computer program product.

Figure 6:
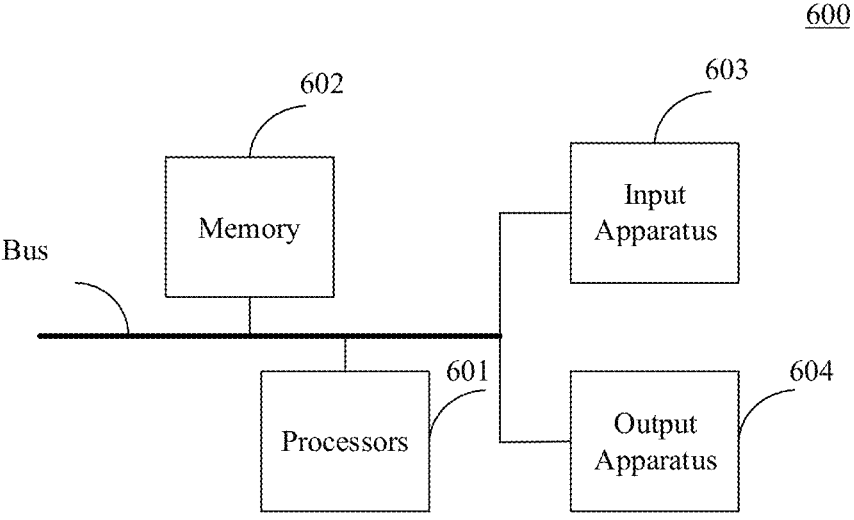
FIG. 6 is a schematic structural diagram of a computer system adapted to implement an electronic device of embodiments of the present disclosure.

As shown in FIG. 6, a block diagram of an electronic device of the method for generating an operator according to embodiments of the present disclosure is shown.

600 is a block diagram of an electronic device of the method for generating an operator according to the embodiments of the present disclosure. The electronic device is intended to represent various forms of digital computers, such as a laptop computer, a desktop computer, a workbench, a personal digital assistant, a server, a blade server, a mainframe computer, and other suitable computers. The electronic device may further represent various forms of mobile apparatuses, such as a personal digital assistant, a cellular phone, a smart phone, a wearable device, and other similar computing apparatuses. The components shown herein, the connections and relationships thereof, and the functions thereof are used as examples only, and are not intended to limit implementations of the present disclosure described and/or claimed herein.

As shown in FIG. 6, the electronic device includes: one or more processors 601, a memory 602, and interfaces for connecting various components, including a high-speed interface and a low-speed interface. The various components are interconnected using different buses, and may be mounted on a common motherboard or in other manners as required. The processor may process instructions for execution within the electronic device, including instructions stored in the memory or on the memory to display graphical information for a GUI on an external input/output apparatus (e.g., a display device coupled to an interface). In other implementations, a plurality of processors and/or a plurality of buses may be used, as appropriate, along with a plurality of memories and a plurality of memories. Similarly, a plurality of electronic devices may be connected, with each device providing portions of necessary operations (e.g., as a server array, a group of blade servers, or a multi-processor system). In FIG. 6, a processor 601 is taken as an example.

The memory 602 is a non-transitory computer readable storage medium provided in the present disclosure. The memory stores instructions executable by at least one processor, such that the at least one processor executes the method for generating an operator provided in the present disclosure. The non-transitory computer readable storage medium of the present disclosure stores computer instructions. The computer instructions are used for causing a computer to execute the method for generating an operator provided in the present disclosure.

As a non-transitory computer readable storage medium, the memory 602 may be configured to store non-transitory software programs, non-transitory computer executable programs, and modules, e.g., the program instructions/modules (e.g., the first constructing module 501 and the second constructing module 502 shown in FIG. 5) corresponding to the method for generating an operator in the embodiments of the present disclosure. The processor 601 runs non-transitory software programs, instructions, and modules stored in the memory 602, so as to execute various function applications and data processing of a server, i.e., implementing the method for generating an operator in the above embodiments of the method.

The memory 602 may include a program storage area and a data storage area, where the program storage area may store an operating system and an application program required by at least one function; and the data storage area may store, e.g., data created based on use of the electronic device for face tracking. In addition, the memory 602 may include a high-speed random-access memory, and may further include a non-transitory memory, such as at least one disk storage component, a flash memory component, or other non-transitory solid state storage components. In some embodiments, the memory 602 alternatively includes memories disposed remotely relative to the processor 601, and these remote memories may be connected to an electronic device for generating an operator via a network. Examples of the above network include, but are not limited to, the Internet, an intranet, a local area network, a mobile communication network, and a combination thereof.

The electronic device of the method for generating an operator may further include: an input apparatus 603 and an output apparatus 604. The processor 601, the memory 602, the input apparatus 603, and the output apparatus 604 may be connected through a bus or in other manners. Bus connection is taken as an example in FIG. 6.

The input apparatus 603 may receive inputted number or character information, and generate a keying signal input related to user settings and function control of the electronic device for generating an operator, e.g., an input apparatus such as a touch screen, a keypad, a mouse, a trackpad, a touchpad, an indicating arm, one or more mouse buttons, a trackball, and a joystick. The output apparatus 604 may include a display device, an auxiliary lighting apparatus (e.g., an LED), a haptic feedback apparatus (e.g., a vibration motor), and the like. The display device may include, but is not limited to, a liquid crystal display (LCD), a light emitting diode (LED) display, and a plasma display. In some implementations, the display device may be a touch screen.

Various implementations of the systems and technologies described herein may be implemented in a digital electronic circuit system, an integrated circuit system, an ASIC (application specific integrated circuit), computer hardware, firmware, software, and/or a combination thereof. The various implementations may include: an implementation in one or more computer programs that are executable and/or interpretable on a programmable system including at least one programmable processor, which may be a special-purpose or general-purpose programmable processor, and may receive data and instructions from, and transmit data and instructions to, a storage system, at least one input apparatus, and at least one output apparatus.

These computing programs (also known as programs, software, software applications, or code) include machine instructions for a programmable processor, and may be implemented in an advanced procedural and/or object-oriented programming language, and/or in an assembly/machine language. As used herein, the terms "machine-readable medium" and "computer readable medium" refer to any computer program product, device, and/or apparatus (e.g., a magnetic disk, an optical disk, a memory, or a programmable logic device (PLD)) configured to provide machine instructions and/or data to a programmable processor, and include a machine-readable medium receiving machine instructions as machine-readable signals. The term "machine-readable signal" refers to any signal used to provide machine instructions and/or data to a programmable processor.

To provide interaction with a user, the systems and technologies described herein may be implemented on a computer that is provided with: a display apparatus (e.g., a CRT (cathode ray tube) or a LCD (liquid crystal display) monitor) configured to display information to the user; and a keyboard and a pointing apparatus (e.g., a mouse or a trackball) by which the user can provide an input to the computer. Other kinds of apparatuses may also be configured to provide interaction with the user. For example, feedback provided to the user may be any form of sensory feedback (e.g., visual feedback, auditory feedback, or haptic feedback); and an input may be received from the user in any form (including an acoustic input, a voice input, or a tactile input).

The systems and technologies described herein may be implemented in a computing system (e.g., as a data server) that includes a back-end component, or a computing system (e.g., an application server) that includes a middleware component, or a computing system (e.g., a user computer with a graphical user interface or a web browser through which the user can interact with an implementation of the systems and technologies described herein) that includes a front-end component, or a computing system that includes any combination of such a back-end component, such a middleware component, or such a front-end component. The components of the system may be interconnected by digital data communication (e.g., a communication network) in any form or medium. Examples of the communication network include: a local area network (LAN), a wide area network (WAN), and the Internet.

The computer system may include a client and a server. The client and the server are generally remote from each other, and usually interact via a communication network. The relationship between the client and the server arises by virtue of computer programs that run on corresponding computers and have a client-server relationship with each other.

The technical solutions according to embodiments of the present disclosure accelerate the operator development, and improve the operator maintainability.

It should be understood that the various forms of processes shown above may be used to reorder, add, or delete steps. For example, the steps disclosed in the present disclosure may be executed in parallel, sequentially, or in different orders, as long as the desired results of the technical solutions disclosed in the present disclosure can be implemented. This is not limited herein.

The above specific implementations do not constitute any limitation to the scope of protection of the present disclosure. It should be understood by those skilled in the art that various modifications, combinations, sub-combinations, and replacements may be made according to the design requirements and other factors. Any modification, equivalent replacement, improvement, and the like made within the spirit and principle of the present disclosure should be encompassed within the scope of protection of the present disclosure.

What is claimed is:

1. A method for generating an operator, comprising:
   constructing a group of basic application programming interfaces for providing one of following basic functions: an access function, a storage function, and a computing function;
   constructing a kernel application programming interface for invoking the group of basic application programming interfaces to implement an operator logic, wherein constructing the group of basic application programming interfaces comprises;
   acquiring a category of a hardware architecture of a target kernel operator of a deep neural network framework, wherein the hardware architecture comprises at least one of a graphics processing unit (GPU) or an embedded neural network processing unit (NPU), and
   constructing the group of basic application programming interfaces adapted to the hardware architecture based on the category of the hardware architecture; and
   generating the target kernel operator adapted to the hardware architecture based on the group of basic application programming interfaces adapted to the hardware architecture and the kernel application programming interface.

2. The method according to claim 1, wherein generating the target kernel operator adapted to the hardware architecture based on the group of basic application programming interfaces adapted to the hardware architecture and the kernel application programming interface comprises:
   generating the target kernel operator based on three types of basic application programming interfaces in the group of basic application programming interfaces and the kernel application programming interface, wherein the three types of basic application programming interfaces are a type of input/output application programming interface, a type of computing application programing interface, and a type of computing rule application programming interface, respectively, wherein the input/output application programming interface is used for completing read/write in a global memory and a register, the computing application programming interface is a general-purpose computing function, and the computing rule application programming interface is used for defining a computing rule in the computing application programming interface for invoking by the computing application programming interface.

3. The method according to claim 2, wherein the computing rule application programming interface is set based on user needs.

4. The method according to claim 1, wherein generating the target kernel operator adapted to the hardware architecture based on the group of basic application programming interfaces and the kernel application programming interface comprises:
   generating, in response to detecting an updating operation on the basic application programming interfaces, an updated group of basic application programming interfaces based on the updating operation; and generating the target kernel operator based on the updated group of basic application programming interfaces and the kernel application programing interface.

5. An apparatus for generating an operator, comprising:

at least one processor; and a memory storing instructions, wherein the instructions when executed by the at least one processor, cause the at least one processor to perform operations, the operations comprising:

constructing a group of basic application programming interfaces for providing one of following basic functions: an access function, a storage function, and a computing function;

constructing a kernel application programming interface for invoking the group of basic application programming interfaces to implement an operator logic, wherein constructing the group of basic application programming interfaces comprises:

acquiring a category of a hardware architecture of a target kernel operator of a deep neural network framework, wherein the hardware architecture comprises at least one of a graphics processing unit (GPU) or an embedded neural network processing unit (NPU), and constructing the group of basic application programming interfaces adapted to the hardware architecture based on the category of the hardware architecture; and generating the target kernel operator adapted to the hardware architecture based on the group of basic application programming interfaces adapted to the hardware architecture and the kernel application programming interface.

6. The apparatus according to claim 5, wherein generating the target kernel operator adapted to the hardware architecture based on the group of basic application programming interfaces adapted to the hardware architecture and the kernel application programming interface comprises:

generating the target kernel operator based on three types of basic application programming interfaces in the group of basic application programming interfaces and the kernel application programming interface, wherein the three types of basic application programming interfaces are a type of input/output application programming interface, a type of computing application programing interface, and a type of computing rule application programming interface, respectively, wherein the input/output application programming interface is used for completing read/write in a global memory and a register, the computing application programming interface is a general-purpose computing function, and the computing rule application programming interface is used for defining a computing rule in the computing application programming interface for invoking by the computing application programming interface.

7. The apparatus according to claim 6, wherein the computing rule application programming interface is set based on user needs.

8. The apparatus according to claim 5, wherein generating the target kernel operator adapted to the hardware architecture based on the group of basic application programming interfaces and the kernel application programming interface comprises:

generating, in response to detecting an updating operation on the basic application programming interfaces, an updated group of basic application programming interfaces based on the updating operation; and generating the target kernel operator based on the updated group of basic application programming interfaces and the kernel application programming interface.

9. A non-transitory computer readable storage medium storing computer instructions, wherein the computer instructions are used for causing a computer to execute operations comprising:

constructing a group of basic application programming interfaces for providing one of following basic functions: an access function, a storage function, and a computing function;

constructing a kernel application programming interface for invoking the basic application programming interfaces to implement an operator logic, wherein constructing the group of basic application programming interfaces comprises;

acquiring a category of a hardware architecture of a target kernel operator of a deep neural network framework, wherein the hardware architecture comprises at least one of a graphics processing unit (GPU) or an embedded neural network processing unit (NPU), and constructing the group of basic application programming interfaces adapted to the hardware architecture based on the category of the hardware architecture; and generating the target kernel operator adapted to the hardware architecture based on the group of basic application programming interfaces adapted to the hardware architecture and the kernel application programming interface.

10. The non-transitory computer readable storage medium according to claim 9, wherein generating the target kernel operator adapted to the hardware architecture based on the group of basic application programming interfaces adapted to the hardware architecture and the kernel application programming interface comprises:

generating the target kernel operator based on three types of basic application programming interfaces in the group of basic application programming interfaces and the kernel application programming interface, wherein the three types of basic application programming interfaces are a type of input/output application programming interface, a type of computing application programing interface, and a type of computing rule application programming interface, respectively, wherein the input/output application programming interface is used for completing read/write in a global memory and a register, the computing application programming interface is a general-purpose computing function, and the computing rule application programming interface is used for defining a computing rule in the computing application programming interface for invoking by the computing application programming interface.

11. The non-transitory computer readable storage medium according to claim 10, wherein the computing rule application programming interface is set based on user needs.

12. The non-transitory computer readable storage medium according to claim 9, wherein generating the target kernel operator adapted to the hardware architecture based on the group of basic application programming interfaces and the kernel application programming interface comprises:

generating, in response to detecting an updating operation on the basic application programming interfaces, an updated group of basic application programming interfaces based on the updating operation; and generating the target kernel operator based on the updated group of basic application programming interfaces and the kernel application programing interface.

* * * * *